United States Patent
Park et al.

(10) Patent No.: US 10,073,741 B2
(45) Date of Patent: Sep. 11, 2018

(54) MEMORY SYSTEM WITH REDUCED PROGRAM TIME AND METHOD OF OPERATING THE SAME

(71) Applicant: SK hynix Inc., Gyeonggi-do (KR)

(72) Inventors: Won Sun Park, Seoul (KR); Mi Ock Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 108 days.

(21) Appl. No.: 15/064,186

(22) Filed: Mar. 8, 2016

(65) Prior Publication Data

US 2017/0116083 A1  Apr. 27, 2017

(30) Foreign Application Priority Data

Oct. 21, 2015 (KR) .......................... 10-2015-0146711

(51) Int. Cl.
*G06F 11/14* (2006.01)
*G06F 3/06* (2006.01)

(52) U.S. Cl.
CPC .......... *G06F 11/142* (2013.01); *G06F 3/0619* (2013.01); *G06F 3/0632* (2013.01); *G06F 3/0644* (2013.01); *G06F 3/0673* (2013.01); *G06F 2201/805* (2013.01); *G06F 2201/85* (2013.01)

(58) Field of Classification Search
CPC ............. G06F 11/1072; G06F 11/1008; G06F 11/142; G06F 2201/805; G06F 2201/85; G06F 3/0632; G06F 3/0619; G06F 3/0644
See application file for complete search history.

(56) References Cited

U.S. PATENT DOCUMENTS

| 6,813,184 | B2* | 11/2004 | Lee | G11C 16/3454 365/185.09 |
| 7,298,650 | B2* | 11/2007 | Khouri | G11C 16/26 365/185.12 |
| 7,383,476 | B2* | 6/2008 | Crowley | G06F 11/1008 365/130 |
| 7,783,941 | B2* | 8/2010 | Kim | G11C 29/42 714/711 |
| 7,908,429 | B2* | 3/2011 | Pyeon | G06F 13/4247 710/52 |
| 8,060,691 | B2* | 11/2011 | Pyeon | G06F 13/4243 710/52 |
| 8,693,251 | B2* | 4/2014 | Roohparvar | G11C 11/5628 365/185.12 |

(Continued)

FOREIGN PATENT DOCUMENTS

KR  1020150048426  5/2015

*Primary Examiner* — Nadeem Iqbal
(74) *Attorney, Agent, or Firm* — IP & T Group LLP

(57) ABSTRACT

In one aspect of the present disclosure, there is provided a memory system comprising a memory device configured to temporarily store data therein, the data being loaded thereon for programming a selected page among multiple pages, the memory device further configured to program the selected page using the data; and a controller configured to send the data to the memory device, wherein the controller is further configured to control the memory device such that, in a failure event of the program for the selected page, the memory device re-programs another page using the data temporarily stored therein without receipt of further data from the controller.

20 Claims, 5 Drawing Sheets

(56) References Cited

U.S. PATENT DOCUMENTS

| | | | | |
|---|---|---|---|---|
| 8,705,273 B2* | 4/2014 | Kim | ................ | G11C 5/14 |
| | | | | 365/185.03 |
| 2008/0209110 A1* | 8/2008 | Pyeon | ................ | G06F 13/4243 |
| | | | | 711/103 |
| 2010/0275056 A1* | 10/2010 | Pyeon | ................ | G06F 13/4247 |
| | | | | 714/6.12 |
| 2011/0131445 A1* | 6/2011 | Pyeon | ................ | G06F 13/4247 |
| | | | | 714/6.2 |

* cited by examiner

MEMORY SYSTEM WITH REDUCED PROGRAM TIME AND METHOD OF OPERATING THE SAME

CROSS-REFERENCE TO RELATED APPLICATION

The present application claims a priority to a Korean patent application number 10-2015-0146711 filed on Oct. 21,2015, the entire disclosure of which is incorporated herein in its entirety by reference.

BACKGROUND

Technical Field

The present disclosure relates to a memory system and, in particular, to a programming operation for a memory system.

Discussion of Related Arts

A memory system has a wide variety of applications as a memory component in a digital device such as a computer, digital camera, audio player, smart-phone or the like. The memory system may include a memory device for storing data and a controller for controlling the memory device. When the digital device acts as a host, the controller may communicate a command and data between the host and the memory device.

In a program operation, the controller may send a command for the program, and an associated address and data to the memory device, which may be programed based on the command, address and data.

Upon completion of the program, the controller may determine whether the program operation was successful or failed. Upon determination that the program operation failed, the controller may re-send a command for the programming, and an associated address and data to the memory device, which may be re-programmed based on the newly received command, address and data.

SUMMARY

The present disclosure may provide a memory system with a reduced program time, and a method of operating the same.

In one aspect of the present disclosure, there is provided a memory system comprising a memory device configured to temporarily store data therein, the data being loaded thereon for programming a selected page among multiple pages, the memory device further configured to program the selected page using the data; and a controller configured to send the data to the memory device, wherein the controller is further configured to control the memory device such that, in a failure event of the program for the selected page, the memory device re-programs another page using the data temporarily stored therein without receipt of further data from the controller.

In one aspect of the present disclosure, there is provided a method for operating a memory system, the method comprising: sending a first address and data to the memory device; storing the data in the memory device; performing a first-program for the memory device using the first address and the data; determining whether the first program passes or fails; in a pass event of the first program, ending the first-program, or in a fail event of the first program, sending a second address to the memory device; and performing a second-program for the memory device using the second address and the data stored in the memory device, In one aspect of the present disclosure there is provided a method for operating a memory system, the method comprising: sending a first program command to a selected memory device to reset a page buffer of the selected memory device; loading a first address onto the selected memory device; storing the data in the page buffer of the memory device; performing, with the data stored in the page buffer, a first-program for a selected page based on the first address; in a fail event of the first program sending a second program command to the selected memory device to keep the data in the page buffer; sending a second address to the selected memory device; and performing, with the data stored in the page buffer, a second-program for a selected page based on the second address.

In accordance with the present disclosure, when a certain program operation is determined to be in a failure state, and, thus, a re-program operation for the same is necessary, the data stored already in the sub-memory device subjected to the prior program operation may be used as it is for the subsequent re-program operation. This may lead to an omission of a data input interval from the externals, for example the controller, for the re-program operation. This may lead to a reduction of a program operation time for the memory system.

BRIEF DESCRIPTION OF THE DRAWINGS

A brief description of each drawing is provided to more fully understand the drawings, which is incorporated in the detailed description of the disclosure.

DETAILED DESCRIPTIONS

Figure 1:
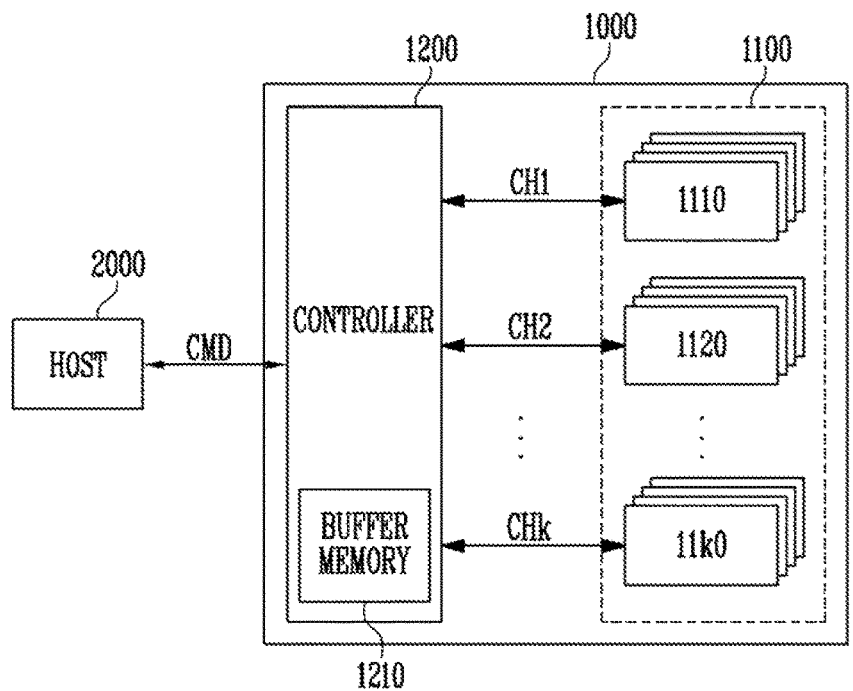
FIG. 1 is a diagram illustrating a memory system, according to an embodiment of the present disclosure.

Various embodiments are described below in reference with the accompanying drawings. It will be understood that the discussion herein is not intended to limit the claims to the specific embodiments described. On t he contrary, it is, intended to cover alternatives, modifications and equivalents as may be included within the spirit and or scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, t will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", at "comprising", "includes", and "including" when used in this specification, specify the presence of the stated features, integers, s, operations, elements, and/or components, but do not preclude the presence or addition of one or more other features, integers, s, operations, elements, components, and/or groups thereof. As used herein, the term "and/or" includes any and all combinations of one or more of the associated listed items.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

FIG. 1 is a diagram illustrating a memory system, according to an embodiment of the present disclosure, Referring to FIG. 1, a memory system 1000 may include a memory device 1100 for storing data and a controller 1200 for controlling the memory device 1100, The memory device 1100 may be divided into a plurality of sub-memory device groups 1110, 1120 and 11k0. Each of the sub-memory device groups 1110, 1120 and 11k0 may include a plurality of sub-memory devices. Each of the sub-memory device groups 1110, 1120 and 11k0 may communicate with the controller 1200 over a respective channel among a plurality of channels CH1, CH2, . . . , CHk, wherein k is a positive integer.

The controller 1200 may receive a command CMD from a host 2000, and may control the sub-memory device groups 1110, 1120 and 1110 via a respective channel CH1, CH2, . . . , or CHk based on the received command CMD. Further, the controller 1200 may include a buffer memory 1210 for storing data temporarily for a program, read or erase operation.

Figure 2:
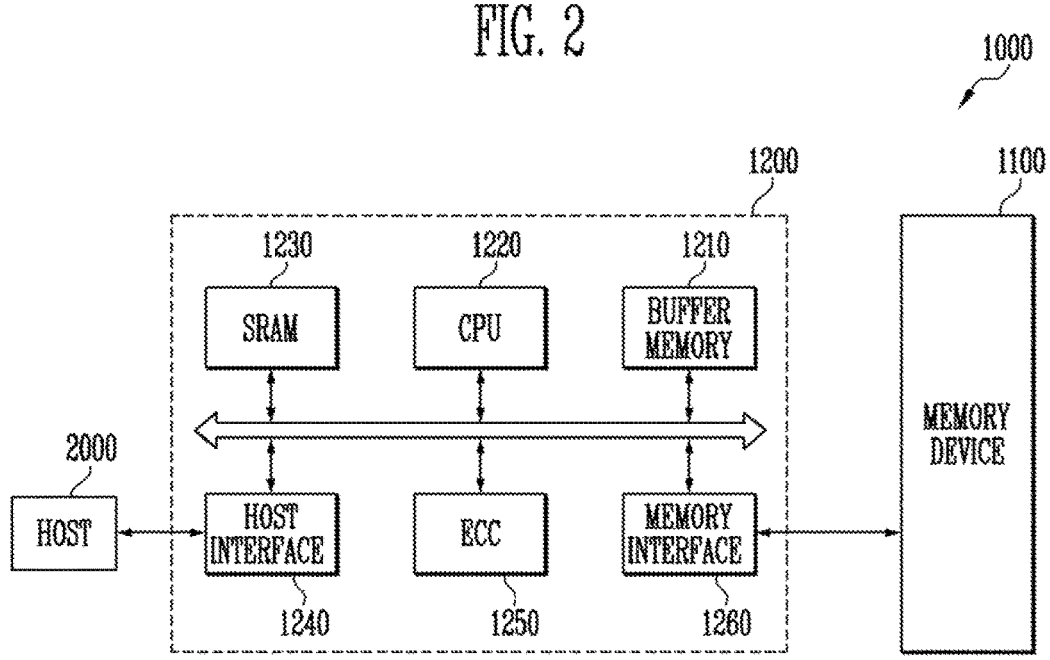
FIG. 2 is a diagram illustrating various components of an example configuration of a controller employed in the memory system of FIG. 1.

In the program operation, the buffer memory 1210 may store data temporarily, as may be needed, before further transferring the data, for example, to the memory device 1100 or to the host 2000. For example, the controller 1200 may transfer the data stored in the buffer memory 1210 to the memory device 1100 which, in turn, may carry out a program based on the received data. When the program operation fails, the controller 1200 instead of re-sending the data to the memory device 1100 may control the memory device 1100 to re-use the previously-sent data for which the program operation failed, Referring to FIG. 2, the memory system 1000, according to an embodiment of the present disclosure, may include the memory device 1100 for storing data, and the controller 1200 for controlling the memory device 1100. Further, the controller 1200 may control a communication between a host 2000 and the memory device 1100. To this end, the controller 1200 may include a buffer memory 1210, a central processing unit (CPU) 1220, a static random access memory (SRAM) 1230, a host interface 1240, an error correction code (ECC) module 1250 and a memory interface 1260.

The buffer memory 1210 may store therein temporarily data which is to be sent by the controller 1200 to the memory device 1100 in a program operation. The CPU 1220 may control a data exchange of the controller 1200. The SRAM 1230 may act as a work memory for the CPU 1220. The host interface 1240 may have a data exchange protocol for the host 2000 coupled to the memory system 1000. The ECC module 1250 may detect and correct an error in data read from the memory device 1100. The memory interface 1260 may interface with the memory device 1110.

The CPU 1220 may be configured to run firmware such as a flash translation layer (FTL). The FTL may have a variety of functions. In an example, the FTL may include a variety of layers, such as a program timing layer, a retrieval layer, an address mapping layer, a read correction layer, etc. In an example, when a programming for a selected page fails, the FTL may change the selected page address to another page address. The changed page address may be delivered via the memory interface 1260 to the memory device 1100.

Figure 3:
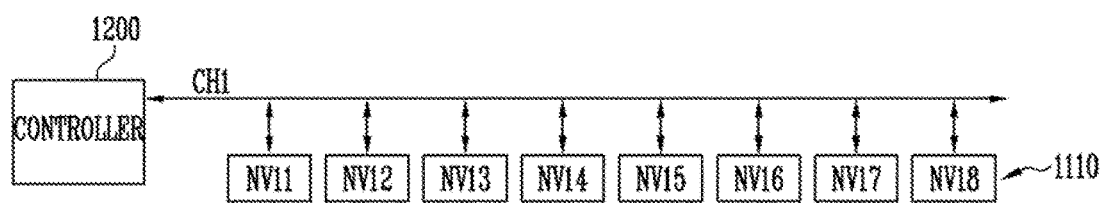
FIG. 3 is a diagram illustrating a single sub-memory device group of the memory system of FIG. 1.

FIG. 3 is a diagram illustrating a single sub-memory device group 1110 of the memory device of FIG. 1.

Referring to FIG. 3, there is illustrated a connection relation between the first sub-memory device group 1110 from among the sub-memory device groups 1110, 1120 and 11k0 and the controller 1200. Each of the remaining sub-memory device groups 1120 to 11k0 in FIG, 1 may have the same connection relation with the controller 1200 as the first sub-memory device group 1110.

The first sub-memory device group 1110 may include a plurality of sub-memory devices NV11 to NV18, all of which are coupled to a sing e first channel CH1 linking them to the controller 1200. It is noted that although this example shows that the first sub-memory devices group 1110 includes eight sub-memory devices NV11 to NV18 for the sake of convenience of illustration, the present disclosure may not be limited thereto. Fewer or more sub-memory devices than the eight sub-memory devices may be included in a sub-memory device group depending on the memory system. Each of the sub-memory devices NV11 to NV18 may be implemented in a volatile memory device or a non-volatile memory device. It may be cases that the sub-memory device may be implemented in non-volatile memory device when employed in a portable electronic device. In an example, each of the sub-memory devices NV11 to NV18 may be implemented in a NAND flash memory device.

Figure 4:
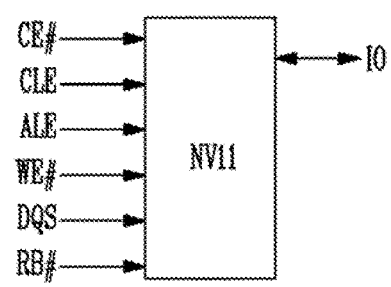
FIG. 4 is a diagram illustrating a single sub-memory device of the sub-memory device group of FIG. 3.

FIG. 4 is a diagram illustrating a single sub-memory device of FIG. 3. The first sub-memory device NV11 from among the sub-memory devices NV11 to NV18 in FIG. 3 is illustrated by way of example. Each of the remaining second to eighth sub-memory devices NV12 to NV18 in FIG. 3 may have the same configuration as the first sub-memory device NV11.

Referring to FIG. 4, the first sub-memory device NV11 may receive, via the first channel CH1 in FIGS. 1 and 3 a chip enable signal CE# a command latch enable signal CLE, an address latch enable signal ALE, a write enable signal WE#, a data strobe, signal DQS, a ready-busy signal RB# and the like. The first sub-memory device NV11 may also receive a command, an address, data, and the like via an input/output line IO. Further, the first sub-memory device NV11 may output status data via the input/output line IO.

The chip enable signal CE# may be selectively applied to the sub-memory devices coupled to a single channel, while each of the remaining signals CLE, ALE, WE#, and RB# may be commonly applied to the sub-memory devices coupled to the single channel. Further, the input/output line IO may be coupled commonly to the sub-memory devices. In an example, the chip enable signal CE # may be selectively applied to each: of the sub-memory devices NV11 to NV18 coupled commonly to the first channel CH1, while each of the remaining signals CLE, ALE, WE#, and RB# may be commonly applied to the sub-memory devices NV11 to NV18 coupled commonly to the first channel CH1.

The chip enable signal CE# may be applied having a low value to a selected sub-memory device when the command, address or data is inputted to the selected sub-memory device. In this connection, remaining non-selected (idle) sub-memory devices may have the chip enable signal CE# having a high value applied thereto. The command latch enable signal CLE may be set to a high value when the command is inputted to the sub-memory device(s). The address latch enable signal ALE may be set to a high value when the address is inputted to the sub-memory device(s) The ready-busy signal RB # may be set to a low value when the selected sub-memory device is performing a program operation. The write enable signal WE # may toggle when the command and address are loaded onto the sub-memory device(s). The data strobe signal DQS may toggle when the data is loaded onto the sub-memory device(s).

Figure 5:
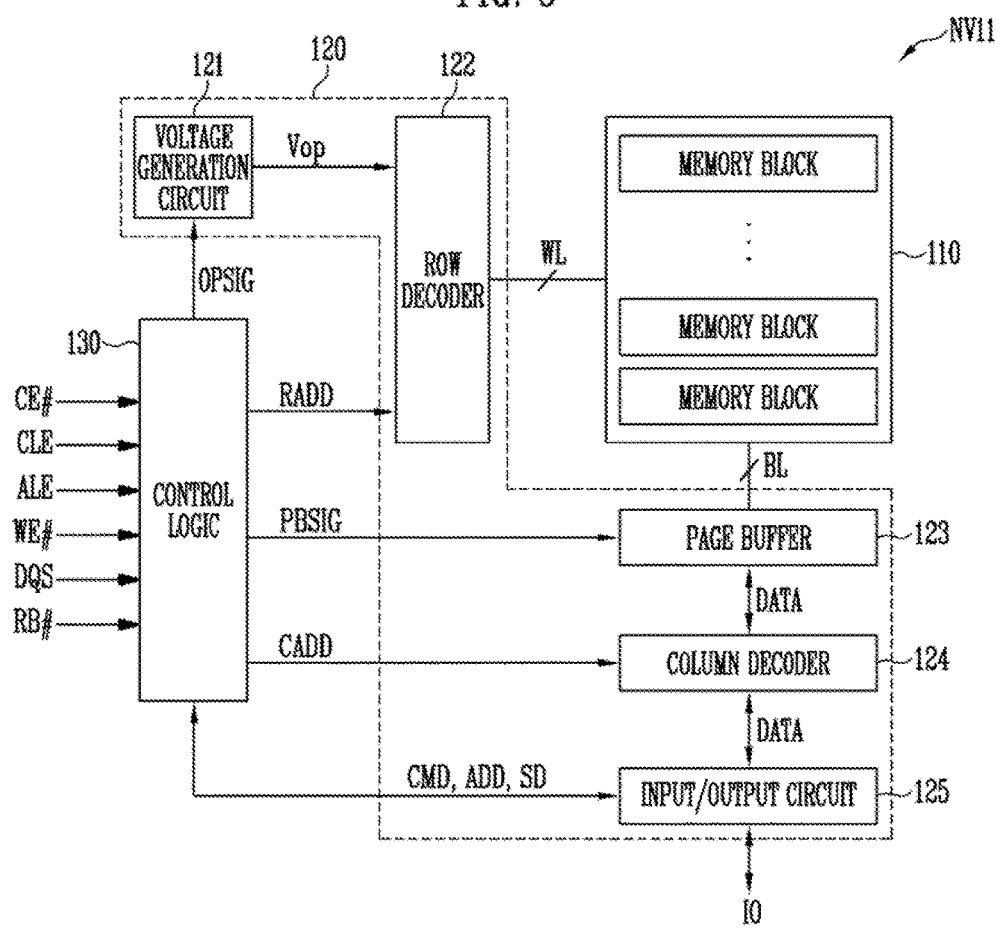
FIG. 5 is a more detailed block diagram of an example of the sub-memory device of FIG, 4.

FIG. 5 is a detailed block diagram of a sub-memory device of FIG. 4. Referring to FIG. 5, the first sub-memory device NV11 is exemplified for convenience of illustration. Each of the remaining second to eighth sub-memory devices NV12 to NV18 of FIG. 3 may have the same configuration as the first sub-memory device NV11.

The first sub-memory device NV11 may include a memory cell array 110 configured to store data therein, a peripheral circuit 120 configured to perform an operation, such as a program, read or erase operation for the memory cell array 110, and a control logic 130 configured for controlling the peripheral circuit 120.

The memory cell array 110 may include a plurality of regions for storing data. Each region may include a plurality of memory blocks. Each of the memory blocks may have a two-dimensional (2D) or three-dimensional (3D) structure. Each memory block may include a plurality of strings wherein each string including a plurality of memory cells. A program may be carried out on a page basis in a selected memory block. The page may refer to a group of memory cells included in different strings which are coupled to a single word line WL.

The peripheral circuit 120 may include a voltage generation circuit 121, a row decoder 122, a page buffer 123, a column decoder 124 and an input/output circuit 125.

The voltage generation circuit 121 may generate one or more operation voltages Vop in response to an operation signal OPSIG. For example, upon a receipt of a program operation signal OPSIG, the voltage generation circuit 121 may generate a program voltage for a program operation, a program pass voltage and a program verification voltage. The row decoder 122 may deliver the operation voltage Vop to word-lines WL coupled to the memory blocks selected in response to a row address RADD.

The page buffer 123 may store temporarily data received from the column decoder 124 in response to a page buffer control signal PBSIG. The page buffer 123 may adjust voltages of bit lines BL coupled to the memory blocks. For example, the page buffer 123 may apply a program-permission voltage or a program-prohibition voltage to the bit lines BL based on data DATA. In this connection, the program-permission voltage may be 0V and the program-prohibition voltage may be a power-source voltage. In particular, the page buffer 123 may store temporarily data DATA received at a start of the program operation, and upon a program-fail, may be configured to allow a re-program using the data DATA already temporarily stored therein instead of receiving again data from the controller 1200 in FIG. 1.

The column decoder 124 may communicate data DATA with the page buffer 123 in response to column address CADD, or may communicate data DATA with the input/output circuit 125.

The input/output circuit 125 may be coupled via the input/output line IO to the memory controller 1200 in FIG. 1, and may communicate the command CMD, address ADD and data DATA via the input/output line IO with the memory controller 1200 in FIG. 1

The control logic 130 may be configured to receive the command CMD and address ADD in response to the chip enable signal CE#, command latch enable signal CLE, address latch enable signal ALE, write enable signal WE#, data strobe signal DQS, and ready-busy signal RB#. Then, the control logic 130 may be configured to output the operation signal OPSIG, row address RADD, page buffer control signal PBSIG and column address CADD in response to the command CMD and address ADD. After completion of a program operation, upon a receipt of a status-checking command CMD, the control logic 130 may be configured to output status data SD including information about whether the program operation was a fail or a pass, i.e., successful.

Figure 6:
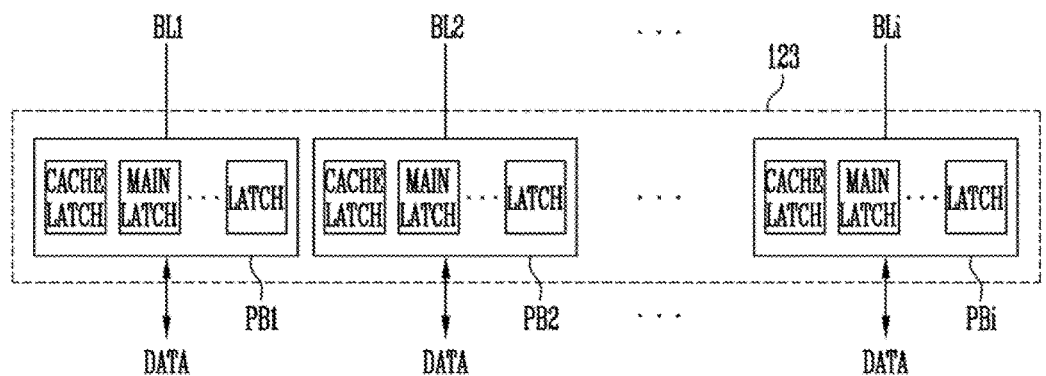
FIG. 6 is a diagram illustrating a page buffer in FIG. 5.

FIG. 6 is a diagram illustrating a page buffer 123 in FIG. 5.

Referring to FIG. 6, the page buffer 123 may include first to i-th sub-page buffers PD1 to PB1 where 1 includes a positive integer. The first to i-th page buffers PB1 to PBi may be respectively coupled to first to i-th bit-lines BL1 to BLi. The first to i-th page buffers PB1 to PBi may include a plurality latches for storing temporarily therein data received from the column decoder 124 in FIG. 5, or for being employed for a program operation. For example, each of the first to i-th page buffers PB1 to PBi may include a cache latch storing temporarily therein data received from the column decoder 124, and a main latch to be employed for a program operation. A memory device employing a multi-level cell (MLC) may use a larger number of latches than a memory device employing a single-level cell (SLC). Further, a memory device employing a triple-level cell (TLC) may use a larger number of latches than a memory device employing a MLC. In other words, a number of latches contained in the first to i-th page buffers PB1 to PIN may be proportional to a number of memory bits of a single memory cell.

In the present disclosure in a program operation, data may be stored temporarily in the cache latches and, then, may be copied to the main latches. The program operation may be carried out using the data stored in the main latches. During the program operation, the temporarily stored data in the cache latches may remain as they are. In an event of a failure for a selected page, the data stored in the cache latches may be once again copied to the respective main latches. Then, a program operation for another page may be carried out using the copied data. More details about the program operation according to the present disclosure are set forth below.

Figure 7:
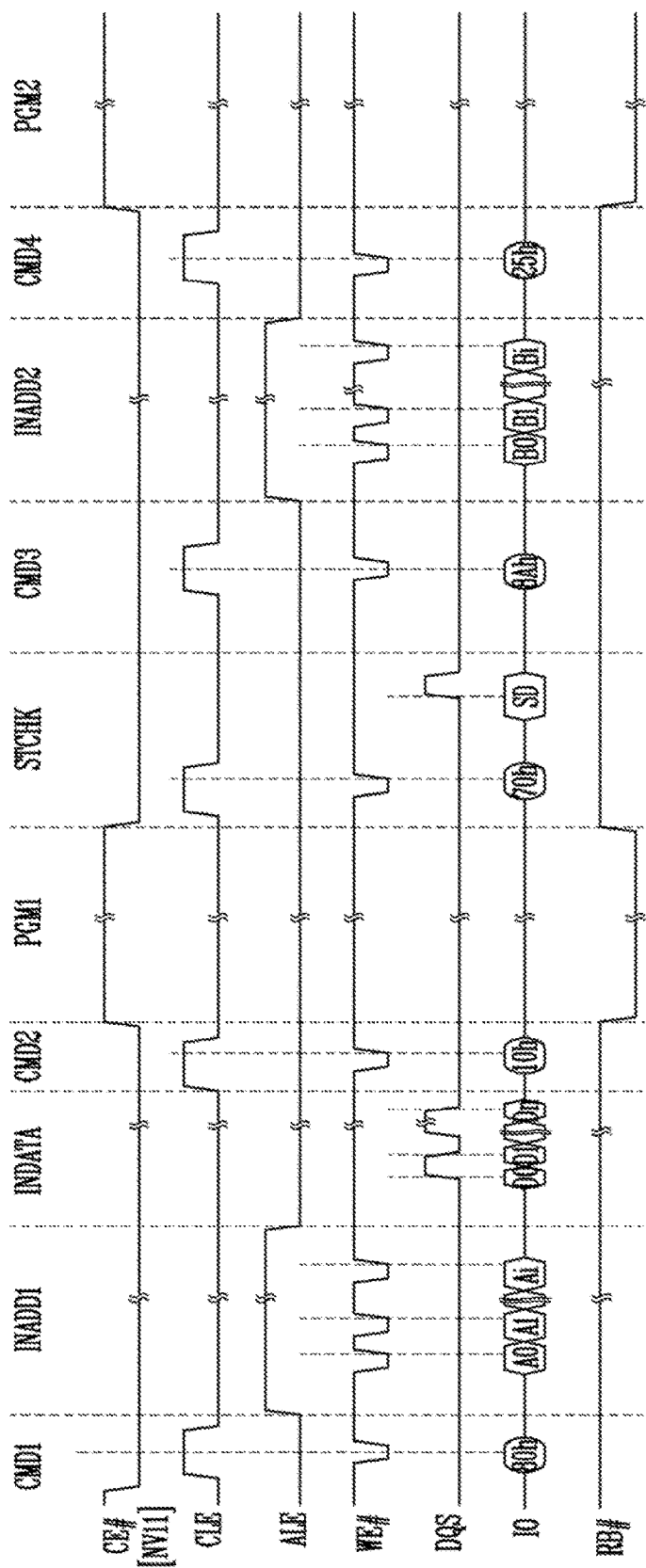
FIG. 7 is a flowchart of a program operation, according to an embodiment of the present disclosure.

FIG. 7 is a flowchart of a program operation, according to an embodiment of the present disclosure.

Referring to FIG. 7, a program operation, according to an embodiment of the present disclosure, may include storing data in the page buffer in response to a program command. Then, a selected page may be programmed using the data stored in the page buffer. After completion of the program operation, in a program pass event, the program operation may end. If a program fails, a program for another page may be performed using the already temporarily stored data in the page buffer instead of once again receiving data from the controller 1200 in FIG. 1.

In order to allow the above-described program operation, the controller 1200 may control a selected sub-memory device by outputting a command, address and data as follows. For the sake of convenience of illustration, hereinafter, a program for the first sub-memory device NV11 may be described by way of example. For example, the program operation may be performed by the controller 1200 and the first sub-memory device NV11 including the page buffer 123 and the control logic 130 in FIG. 3 to FIG. 6.

First Program Command Input Interval CMD1

Upon a start of a first program command input interval CMD1, the controller 1200 in FIG. 3 may apply a low level chip enable signal CE# to the selected first sub-memory device NV11 in FIG. 3. A high level chip enable signal CE# may be applied to remaining non-selected. sub-memory devices NV12 to NV18 in FIG. 3. Since only the first sub-memory device NV11 has a low level chip enable signal CE# applied thereto signals outputted from the controller 1200 may be supplied via a first channel C1-11 only to the first sub-memory device NV11.

When the first sub-memory device NV11 is supplied with the low level chip enable signal CE#, the controller 1200 may transition a command latch enable signal CLE from a low level to a high level, and, then, may output a first program command 80h via an input/output line IO When the input/output line IO has the first program command 80h applied thereto, and, at this state, a write enable signal WE# may transition from a high to a low level and, then again, to a high level, the first program command 80h applied to the input/output line IO may be loaded onto the first sub-memory device NV11. In other words, the first program command 80h applied to the input/output line IO may be loaded onto the first sub-memory device NV11 in a synchronized manner with the write enable signal WE* when the write enable signal WE* toggles. When the first program command 80h has been loaded onto the first sub-memory device NV11 the command latch enable signal CLE may transition from a high to a low level.

The first sub-memory device NV11 may perform preparation operation for a program operation in response to the first program command 80h. For example, the first sub-memory device NV11 may reset the page buffer 123 in FIG. 6. More specifically, the control logic 130 in FIG. 5 contained in the first sub-memory device NV11 may output a page buffer control signal PBSIG in response to the first program command 80h so that latches including cache latches and main latches included in the page buffer 123 may be reset. When the latches included in the page buffer 123 have been reset, a first address input interval INADD1 may be performed.

First Address Input Interval INADD1

Upon a start of the first address input interval INADD1, the controller 1200 may transition an address latch enable signal ALE from a low level to a high level. While the address latch enable signal ALE is kept at the high level, the controller 1200 may apply sequentially a first address A0, A1, . . . , Ai to the input/output line IO. When the first address A0, A1, . . . , Ai is entered sequentially to the input/output line IO, and, at this state, the address latch enable signal ALE toggles, the address latch enable signal ALE may be loaded sequentially onto the first sub-memory device NV11 in a synchronized manner with the toggling address latch enable signal ALE. The first address A0, A1, . . . , Ai may include a page address for a first program. More specifically, the first address A0, A1, . . . , Ai may include a first region address, a first memory block address and a first page address contained in a memory cell array 110 in FIG. 5 of the first sub-memory device NV11. When all of the first address A0, A1, . . . , Ai have been loaded onto the first sub-memory device NV11, the address latch enable signal ALE may transition to a low level and, then, a data input interval INDATA may be carried out.

Data Input Interval INDATA

Upon a start of the data input interval INDATA, the controller 1200 may sequentially apply data D0, D1, . . . , Dn to the input/output line I. The data input interval INDATA may be carried out only when a program for a selected page is performed for the first time. W hen the data D0 D1, . . . , Dn is applied sequentially to the input/output line 10, and, at this state, data strobe signal DQS toggles, the data D0, D1, . . . , Dn may be sequentially loaded onto the first sub-memory device NV11 in a synchronized manner with the toggling data strobe signal DQS.

More specifically, when the data strobe signal DQS toggles, the data D0, D1, . . . , Dn may be sequentially stored in cache latches of the page buffer 123, and, then, the data D0, D1, . . . , Dn stored in the cache latches may be copied to main latches.

When all of the data D0, D1, . . . , Dn have been stored in the cache latches and the main latches of the page buffer 123 a first start command input interval CMD2 may be carried out.

First Start Command Input Interval CMD2

Upon a start of the first start command input interval CMD2, the controller 1200 may transition a command latch enable signal CLE from a low level to a high level and, then, output a first start command 10h to the input/output line IO. When the input/output line IO has received the first start command 10h and, at this state, a write enable signal WE# transitions from a high to a low level and, then again, to a high level, the first start command 10h applied to the input/output line IO may be loaded onto the first sub-memory device NV11. In other words, when the write enable signal WE# toggles, the first start command 10h applied to input/output line IO may be loaded on the first sub-memory device NV11 in a synchronized manner with the toggling write enable signal WE. When the first start c and 1.0h has been loaded onto the first sub-memory device NV11, the command latch enable signal CLE may transition from a high to a low level.

First Program Operation Interval PGM1

The first sub-memory device NV11 may perform a first program operation PGM1 in response to the first start command 10h. While the first program operation PGM1 is carried out, the chip enable signal CE# applied to the first sub-memory device NV11 may transition from a low level to a high level, and a ready-busy signal RB# may transition from a high to a low level.

The first program operation is further described more specifically below.

The control logic 130 included in the first sub-memory device NV11 may control the peripheral circuit 120 in FIG. 5 to program memory cells in a selected page in response to the first start command 10h. For example, the control logic 130 may output, in response to the first start command 10h, an operation signal OPSIG, row address RADD, page buffer control signal PBSIG, and column address CADD. In this connection, the row address RADD may be outputted based on the first address A0, A1, . . . , Ai loaded at the first address input interval INADD1. The first program operation may be carried out using the data stored in the main latches of the page buffer 12 In this connection, the data already stored in the cache latches of the page buffer 123 may be maintained as it is.

Upon completion of the first program operation, the ready-busy signal RB# may transition from a low level to a high level and, further, a status check interval STCHK may be initiated to determine whether the first program operation passes or fails. The first program operation may end, for example, according to the following described events.

In a case where the first program operation is implemented in an Incremental Step Pulse Program (ISPP) manner, when all of threshold voltages of the memory cells in the selected page reach a target level, the first program operation comes into a pass state and, thus, ends. In this connection, the control logic 130 may store state data corresponding to the pass state in a register contained in the control logic 130. To the contrary, when any one of threshold voltages of the memory cells in the selected page do not reach the target level, the first program operation comes into a fail state and, then, ends.

Here, a failure of the first program operation will be more specifically described. In case of the ISPP-implemented program operation, program loops with program pulse increments respectively may be carried out until all of threshold voltages of the memory cells in the selected page may reach the target level. When thee threshold voltages of the memory cells in the selected page may not increase beyond a certain level, a maximum program loop number may be set in order to prevent an infinite repetition of program loops. In other words, when threshold voltages of the memory cells in the selected page may not reach the target level until the program loop number reaches the maximum program loop number, the first program operation may come into a fail state, and, then, may end. In this connection, the control logic 130 may store status data corresponding to the fail state in a register contained in the control logic 130.

State Check Interval STCHK

Upon completion of the first program operation, since the controller 1200 may be unaware of whether the first program operation passed or failed, a status check interval STCHK may be carried out to determine a program state.

Upon a start of the status check interval STCHK, the controller 1200 may transition the chip enable signal CE # applied to the first sub-memory device NV11 from a high to a low level. Thereafter, the controller 1200 may transition the command latch enable signal CLE from a low level to a high level, and, thereafter, output a first status check command 70h to the input/output line IO. When the status check command 70h is applied to the input/output line IO, and, at this state, the write enable signal WE# transitions from a high to a low level and, then again, to a high level, the status check command 70h applied to the input/output line IO may be loaded on the first sub-memory device NV11. In other words, when the write enable signal WE# toggles, the status check command 70h applied to the input/output line IO may be loaded onto the first sub memory device NV11 in a synchronized manner with the toggling write enable signal WE#. When the status check command 70h has been loaded onto the first sub-memory device NV11, the command latch enable signal CLE may transition from a high to a low level.

The first sub-memory device NV11 may output the status data SD stored in the control logic 130 to the input/output line IO in response to the status check command 70h. Upon a determination based on the status data SD indicating that the first program operation passed, the controller 1200 may control the first sub-memory device NV11 to program a next selected page.

To the contrary, upon a determination based on the status data SD indicating that the first program operation failed, a second program command input interval CD3 may be carried out for re-performing the program operation.

Second Program Command Input Interval CMD3

Upon a start of the second program command input interval CMD3 for re-performing the failed program operation, the controller 1200 may transition the command latch enable signal CLE from a low level to a high level and, thereafter, output a second program command 8Ah to the input/output line IO. When the input/output line IO has received the second program command 8Ah and, at this state, the write enable signal WE# transitions from a high to a low level and, then again, to a high level, the second program command 8Ah applied to the input/output line IO may be loaded onto the first sub-memory device NV11. In other words, the second program command 8Ah applied to the input/output ine IO may be loaded onto the first sub-memory device NV11 in a synchronized manner with the write enable signal WE# when the write enable signal WE# may toggle. When the second program command 8Ah has been loaded onto the first sub-memory device NV11, the command latch enable signal CLE may transition from a high to a low level.

The first sub-memory device NV11 may perform a preparation operation for a program operation in response to the second program command 8Ah. For example, the first sub-memory device NV11 may reset the main latches in the page buffer 123. More specifically, the control logic 130 contained in the first sub-memory device NV11 may output a page buffer control signal PBSIG in response to the second program command 8Ah so that the data stored already in the cache latches may be copied to the main latches included in the page buffer 123. Upon completion of the copying, a second address input interval INADD2 may be performed, Second Address Input Interval INADD2

Upon a start of the second address input interval INADD2, the controller 1200 may generate a second address B0, B1, . . . , Bi wherein the second address B0, B1, . . . , Bi may correspond to a variation of the first address A0 A1, . . . , Ai inputted in the first address input interval INADD1, wherein the variation has a change in at least one address of the memory block address and page address. In other words, since the data for the second program operation is already stored in the page buffer 123 of the first sub-memory device NV11 the region address is not changed for the second program operation.

Assuming that, for the first program operation, a selected region address was a first region address, the first region address may be used as it is for the second program operation. Instead, since the selected page in the selected memory block for the first program operation results in the program-failure, a different page in the same memory block as in the first program operation or a different page in a different memory block may be selected for the second program operation. For example, the second address B0, B1, . . . , Bi may include the first region address and the first memory block address as the same region and memory block addresses as in the first program operation, and a second page address as a different page address from in the first program operation. Alternatively, the second address B0, B1, . . . , Bi may include the first region address as the same region address as in the first program operation, a second memory block address as a different memory block address from in the first program operation, and the first page address as the same page address as in the first program operation. Alternatively, the second address B0, B1, . . . , Bi may include the first region address as the same region address as in the first program operation, a second memory block address as a different memory block address from in the first program operation, and a second page address as a different page address from in the first program operation.

When, as described above the second address B0, B1, . . . , Bi has been generated, the controller 1200 may transition the address latch enable signal ALE from a low level to a high level. While the address latch enable signal ALE is kept having a high level, the controller 1200 may sequentially apply the second address B0, B1, . . . , Bi to the input/output line IO.

When the second address B0, B1, . . . , Bi has been applied sequentially to the input/output line IO and, at this state, the address latch enable signal ALE toggles, the address latch enable signal ALE may be loaded sequentially onto the first sub-memory device NV11 in a synchronized manner with the toggling address latch enable signal ALE. When the second address B0, B1, . . . , Bi has been entirely loaded onto the first sub-memory device NV11 the address latch enable signal ALE may transition to a low level.

Subsequently an interval to input further data to the first sub-memory device NV11 from the controller 1200 may be skipped. Then, a second start command input interval CMD4 may be carried out.

Second Start Command Input Interval CMD4

Upon a start of the second start command input interval CMD4, the controller 1200 may transition the command latch enable signal CLE from a low level to a high level and, then, may output a second start command 25h to the input/output line IO. When the input/output line IO has received the second start command 25h and, at this state, the write enable signal WE# transitions from a high to a low level and, then again, to a high level, the second start command 25h applied to the input/output line IO may be loaded onto the first sub-memory device NV11. In other words, when the write enable signal WE# toggles, the second start command 25h applied to the input/output line IO may be loaded onto the first sub-memory device NV11 in a synchronized manner with the toggling write enable signal WE#, When the second start command 25h has been loaded onto the first sub-memory device NV11, the command latch enable signal CLE may transition from a high to a low level.

Second Program Operation Interval PGM2

The first sub-memory device NV11 may be subjected to the second program operation in response to the second start command 25h, While the second program operation is carried out, the chip enable signal CE# applied to the first sub-memory device NV11 may transition from a low level to a high level, and the ready-busy signal RB# may transition from a high to a low level.

The second program operation may be carried out in the same way as the first program operation except that the page address or memory block address to be programmed may be different there between.

After completion of the second program operation, the control logic 130 ray store status data as in the first program operation. Then, the controller 1200 may determine, with reference to the status data, whether the second program operation passes or fails.

As described above, in a case where a certain program operation is determined to be in a failure state and, thus, a re-program operation for the same is necessary, the data stored already in the sub-memory device subjected to the prior program operation may be used as it is for the subsequent re-program operation. This may lead to an omission of a data input interval from an external device, for example, the controller, for the re-program operation. This may lead to a reduction of a program operation time for the memory system.

Figure 8:
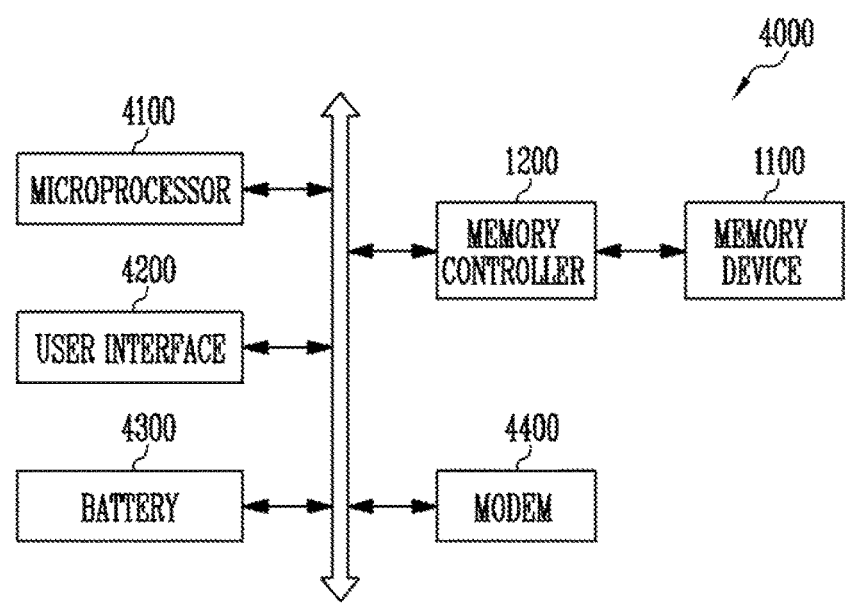
FIG. 8 is a diagram illustrating a computing system including a memory system, according to an embodiment of the present disclosure.

FIG. 8 is a diagram illustrating a computing system 4000 including a memory system, according to an embodiment of the present disclosure, Referring to FIG. 8, the computing system 4000 according to an embodiment of the present disclosure may include the memory device 1100, the memory controller 1200, a microprocessor 4100, a user interface 4200 and a modem 4400, all of which are electrically connected to each other via a system bus. Further, when the computing system 4000 is implemented in a mobile device, the computing system 4000 may be further provided with a battery (not shown) to supply an operation voltage thereof. It may be appreciated that the computing system 4000 may be further provided with an application chipset, camera image processor (CIS) mobile DRAM, etc. The memory controller 1200 and the memory device 1110 together may form a solid state drive/disk (SSD).

In one implementation, the memory system including the memory controller 1200 and the memory device 1100 in the computing system 4000 may be packaged in various forms. For example, such packages may include, but not be limited to, Package on Package (PoP), Bail grid arrays (BGAs), Chip scale packages (CSPs), Plastic Leaded Chip Carrier (PLC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIL), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP) or the like.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to one embodiment, "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A memory system comprising:
a memory device configured to store temporarily data therein, and program a selected page from among a plurality of pages using the data; and
a controller configured to send the data to the memory device, and control the memory device so that, in a failure event of the program for the selected page, the memory device re-programs another page different from the selected page using the data temporarily stored in the same memory device for the program for the selected page,
wherein the controller sends a first command to the memory device so that the memory device programs the selected page using the data, and
wherein the controller sends a second command to the memory device to keep the data in the failure event of the program for the selected page so that the memory device re-programs another page using the data kept in the memory device.

2. The memory system of claim 1, wherein the memory device comprises:
a plurality of memory blocks, each memory block including the plurality pages;
a peripheral circuit configured to store temporarily the data therein, and program the selected page using the data, the selected page being included in a selected memory block among the plurality of memory blocks; and
a control logic configured to control the peripheral circuit.

3. The memory system of claim 2, wherein the peripheral circuit comprises:
a voltage generator configured to generate operation voltages for the program in response to an operation signal;
a row decoder configured to deliver the operation voltages to the selected memory block in response to a row address;
a page buffer configured to store temporarily the data therein, and adjust voltages of bit-lines coupled to the memory blocks based on the data in the programming operation, the page buffer being controlled under a page buffer control signal;
a column decoder configured to communicate data with the page buffer in response to a column address; and
an input/output circuit configured to communicate data with the controller or the column decoder.

4. The memory system of claim 3, wherein the page buffer comprises a plurality of sub-page buffers, wherein each sub-page buffer comprises:
a cache latch configured to store temporarily the data therein; and
a main latch configured to receive the data from the cache latch and store temporarily the data therein, wherein the program is performed using the data stored in the main latch.

5. The memory system of claim 3, wherein the control logic is configured to output the row address, the page buffer control signal, and the column address in response to a command and an address signal.

6. The memory system of claim 1, wherein the controller is configured to:
send a first address to the memory device so that the memory device programs the selected page; and
send a second address to the memory device so that the memory device re-programs another page.

7. The memory system of claim 6, wherein:
the first address corresponds to the selected page, and
the second address corresponds to said another page.

8. The memory system of claim 6, wherein the first address includes a first region address, a first memory block address and a first page address, and
wherein the second address includes one of a first combination of the first region address, a second memory block address and the first page address or a second combination of the first region address, the second memory block address and a second page address.

9. The memory system of claim 6, wherein the controller is configured to
send the second address to the memory device in the failure event of the program for the selected page.

10. A method for operating a memory system including a memory controller and a memory device, the method comprising:
sending, by the controller, a first program command, a first address and data to the memory device, the data being temporarily stored in the memory device;
performing, by the memory device, a first program using the first address and the data;
sending, by the controller, a second address without the data to the memory device in a fail event of the first program; and
performing, by the memory device, a second program using the second address and the data temporarily stored in the same memory device for the first program for the selected page,
wherein the data is not transmitted to the memory device in the fail event of the first program.

11. The method of claim 10, wherein the data is stored temporarily in the memory device for the first program.

12. The method of claim 10, wherein the first and second addresses include a memory block address and a page address, and the first and second addresses are different from each other with respect to a memory block address and/or a page address thereof.

13. The method of claim 10, further comprising: determining whether the first program passes, and ending the first program in a pass event of the first program.

14. A method for operating a memory system including a memory controller and a memory device, the method comprising:
sending, by the memory controller, a first program command to the memory device;
sending, by the memory controller, a first address to the memory device;
sending, by the memory controller, data to the memory device;
temporarily storing, by the memory device, the data in a page buffer of the memory device;

performing, by the memory device, a first program for a selected page among plurality pages of the memory device using the data temporarily stored in the page buffer based on the first address;

sending, by the memory controller, a second program command to the same memory device to keep the data in the page buffer in a fail event of the first program;

sending, by the memory controller, a second address to the memory device; and performing, by the memory device, a second program for another page among the plurality pages based on the second address using the data kept in the page buffer for the first program for the selected page.

15. The method of claim 14, wherein the storing of the data in the page buffer comprises:

storing the data in a cache latch of the page buffer of the memory device; and copying the data from the cache latch to a main latch of the page buffer.

16. The method of claim 15, wherein the first program is performed using the data in the main latch.

17. The method of claim 14, further comprising, after the sending of the second program command, generating the second address by changing partially the first address.

18. The method of claim 14, wherein the first address includes a region address, a memory block address, and a page address, and wherein the second address is generated by changing the memory block address, and/or the page address in the first address.

19. The method of claim 14, wherein the sending of the second program command comprises:

resetting a main latch of the page buffer; and copying the data in a cache latch of the page buffer to the main latch.

20. The method of claim 14, further comprising, after the performing of the first program, determining whether the first program passes or fails.

* * * * *